US012696822B2

(12) United States Patent
Nakamura et al.

(10) Patent No.: US 12,696,822 B2
(45) Date of Patent: Jul. 28, 2026

(54) POWER CONVERSION DEVICE AND MANUFACTURING METHOD THEREFOR

(71) Applicant: Mitsubishi Electric Corporation, Tokyo (JP)

(72) Inventors: Toshifumi Nakamura, Tokyo (JP); Akihiro Sawada, Tokyo (JP); Makoto Matsumoto, Tokyo (JP); Kimihiko Tanaya, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 463 days.

(21) Appl. No.: 18/382,585

(22) Filed: Oct. 23, 2023

(65) Prior Publication Data

US 2024/0347430 A1 Oct. 17, 2024

(30) Foreign Application Priority Data

Apr. 13, 2023 (JP) ................................. 2023-065393

(51) Int. Cl.
| | |
|---|---|
| *H02M 1/14* | (2006.01) |
| *H02M 1/00* | (2007.01) |
| *H10W 70/04* | (2026.01) |
| *H10W 70/40* | (2026.01) |
| *H10W 90/00* | (2026.01) |

(52) U.S. Cl.
CPC ....... *H10W 90/811* (2026.01); *H02M 1/0009* (2021.05); *H02M 1/143* (2013.01); *H10W 70/048* (2026.01); *H10W 70/475* (2026.01)

(58) Field of Classification Search
CPC .................................................. H10W 70/475
See application file for complete search history.

(56) References Cited

U.S. PATENT DOCUMENTS

| | | | | |
|---|---|---|---|---|
| 11,051,430 | B2 * | 6/2021 | Shibata | .............. H05K 7/20454 |
| 2016/0128216 | A1 * | 5/2016 | Harada | .............. H05K 7/14329 |
| | | | | 361/728 |
| 2018/0358903 | A1 * | 12/2018 | Takahashi | ............. H02M 7/003 |
| 2021/0044213 | A1 * | 2/2021 | Kojima | .................... H01G 2/04 |
| 2021/0183568 | A1 | 6/2021 | Kanayama et al. | |
| 2021/0249191 | A1 | 8/2021 | Kodachi et al. | |
| 2022/0158566 | A1 | 5/2022 | Seki et al. | |
| 2023/0396183 | A1 * | 12/2023 | Katsube | .............. H02M 7/003 |

FOREIGN PATENT DOCUMENTS

| | | |
|---|---|---|
| JP | 2020-058214 A | 4/2020 |
| WO | 2020/116138 A1 | 6/2020 |
| WO | 2020/195141 A1 | 10/2020 |

* cited by examiner

*Primary Examiner* — Benjamin P Sandvik
(74) *Attorney, Agent, or Firm* — Sughrue Mion, PLLC

(57) ABSTRACT

This power conversion device includes cast resin provided at least between an inner wall of a storage portion and a smoothing capacitor and between the inner wall of the storage portion and a resistor, so as to be formed integrally, and heat dissipation and vibration protection for the smoothing capacitor and the resistor can be made by the cast resin. Thus, a dedicated assembly process for a structure for heat dissipation and vibration protection for the resistor is not needed, so that the cost is reduced. In addition, reliability of heat dissipation and vibration protection for the discharge circuit is ensured more easily as compared to a conventional method of pressing only one surface of the resistor to the housing by means such as screw fastening.

14 Claims, 8 Drawing Sheets

POWER CONVERSION DEVICE AND MANUFACTURING METHOD THEREFOR

BACKGROUND OF THE INVENTION

1. Field of the Invention

The present disclosure relates to a power conversion device and a manufacturing method therefor.

2. Description of the Background Art

A power conversion device which is provided to an electric vehicle or the like and performs operations such as output adjustment and phase conversion for power, includes a power module having a plurality of power semiconductors in combination, a current detection circuit for detecting output current from the power module, a driving circuit for driving a power semiconductor, a control circuit for outputting a command to a driving circuit, a smoothing capacitor, a discharge circuit, and the like.

The discharge circuit has a resistor and consumes electric charge stored in the smoothing capacitor as heat by the resistor, thus implementing a discharge function. Such a function of the discharge circuit is not a main function of the power conversion device but is an auxiliary function which is only used in short-time operation at the time of stop of the vehicle, collision thereof, or the like. Therefore, for the discharge circuit, it is required that the configuration is simple, cost is low, and the discharge circuit has such high reliability as to assuredly operate when abnormality such as collision of the vehicle occurs.

In order to ensure reliability of a discharge circuit, a structure for appropriately dissipating heat generated in the resistor is needed. If heat dissipation of the resistor is insufficient, the resistor might be burned out during discharge, resulting in loss of the function of the discharge circuit. In addition, since the resistor has great rated power and is a component having comparatively large dimensions, a vibration protection structure is needed.

In a conventional power conversion device, the resistor is fastened to a housing by a screw, whereby functions for heat dissipation and vibration protection are implemented. As a method other than screw fastening, Patent Document 1 describes that a discharge resistor connected to a capacitor element via a wire is placed in a case together with the capacitor element and the case is filled with a potting material that is thermally conductive. In this conventional example, the discharge resistor is placed in contact with a side wall and a bottom wall of the case.

Patent Document 1: Japanese Laid-Open Patent Publication No. 2020-58214

However, in the screw fastening method, a dedicated assembly process for fastening the screw is needed, so that the manufacturing cost for the power conversion device increases. In addition, since heat dissipation performance depends on the degree of close contact between a surface of the resistor and a housing, it is difficult to ensure reliability of heat dissipation performance. If fastening torque for the screw is increased for enhancing the degree of close contact between the resistor and the housing, a problem such as breakage of a screw thread occurs.

Although Patent Document 1 does not disclose a method for fixing the discharge resistor to the case, if the discharge resistor is fixed to the case by the potting material, the discharge resistor might move when the potting material is injected, so that the wire connecting the capacitor element and the discharge resistor might be disconnected. If the discharge resistor is fixed by another method, a dedicated process therefor is needed, so that the manufacturing cost increases. Further, the potting material is not present between the discharge resistor and the case, and heat dissipation performance depends on the degree of close contact between a side surface of the discharge resistor and the case. Therefore, it is difficult to ensure reliability of heat dissipation performance. In addition, vibration at the time of collision of a vehicle or the like is directly transmitted from the case to the discharge resistor. Therefore, a wire connected to the discharge resistor might be damaged.

SUMMARY OF THE INVENTION

The present disclosure has been made to solve the above problems, and an object of the present disclosure is to provide a power conversion device and a manufacturing method therefor that can implement the function of a discharge circuit for discharging electric charge stored in a smoothing capacitor, at low cost, while ensuring reliability of the discharge circuit.

A power conversion device according to the present disclosure includes: a power module including a power device; a smoothing capacitor for smoothing input voltage to the power module; a discharge circuit including a resistor for discharging electric charge stored in the smoothing capacitor; a wiring plate connected to the power module and the smoothing capacitor; a housing storing the power module, the smoothing capacitor, the discharge circuit, and the wiring plate; and cast resin included inside the housing. The housing has a storage portion storing the smoothing capacitor and the resistor. The cast resin is provided at least between an inner wall of the storage portion and the smoothing capacitor and between the inner wall of the storage portion and the resistor, so as to be formed integrally.

A manufacturing method for a power conversion device according to the present disclosure includes the steps of: preparing a power module including a power device, a smoothing capacitor, a discharge circuit including a resistor, a wiring plate connected to the power module and the smoothing capacitor, a housing having a storage portion, and cast resin that has not been cured; fixing the wiring plate to the housing so as to cover an opening of the storage portion in a state in which the smoothing capacitor and the resistor are placed inside the storage portion; and injecting the cast resin into the storage portion from one or more through holes provided in the wiring plate fixed to the housing, so that the cast resin is provided at least between an inner wall of the storage portion and the smoothing capacitor and between the inner wall of the storage portion and the resistor, so as to be formed integrally.

In the power conversion device according to the present disclosure, heat dissipation and vibration protection for the smoothing capacitor and the resistor are made by the cast resin provided in the storage portion so as to be formed integrally. Thus, a dedicated assembly process for a structure for heat dissipation and vibration protection for the resistor is not needed, so that the cost is reduced. In addition, since heat dissipation and vibration protection for the resistor are made by the cast resin, reliability of heat dissipation and vibration protection for the discharge circuit is ensured more easily as compared to a conventional method of pressing only one surface of the resistor to the housing by means such as screw fastening.

In the manufacturing method for the power conversion device according to the present disclosure, the step of injecting the cast resin into the storage portion from the through hole provided in the wiring plate is performed after the step of fixing the wiring plate to the housing. Therefore, such an adverse effect that the cast resin that has not been cured adheres to a wiring plate fixation part provided to the housing, does not occur. Thus, workability is improved and cost reduction is achieved.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

First Embodiment

Figure 1:
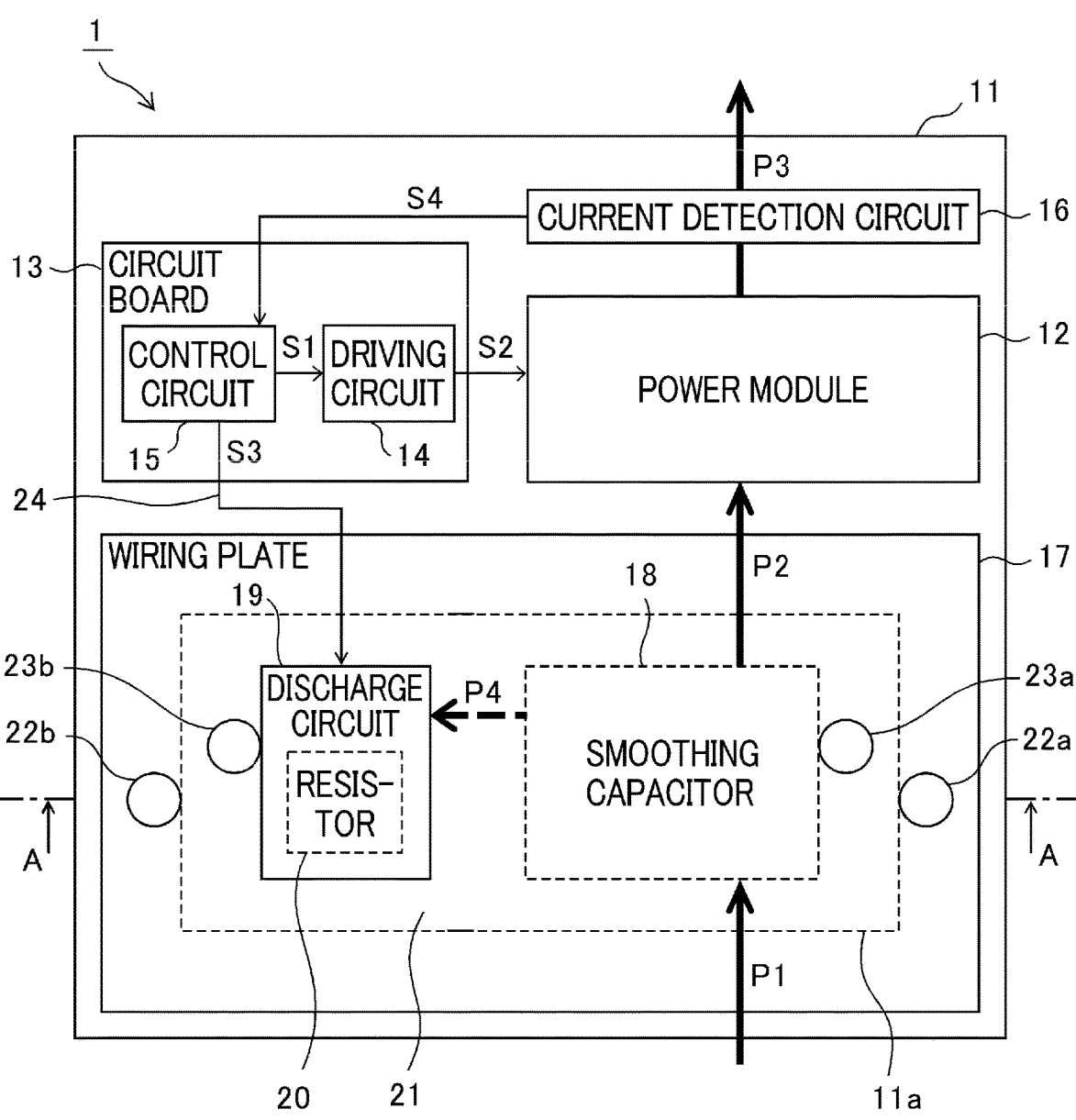
FIG. 1 is a plan view schematically showing the configuration of a power conversion device according to the first embodiment of the present disclosure.
Figure 2:
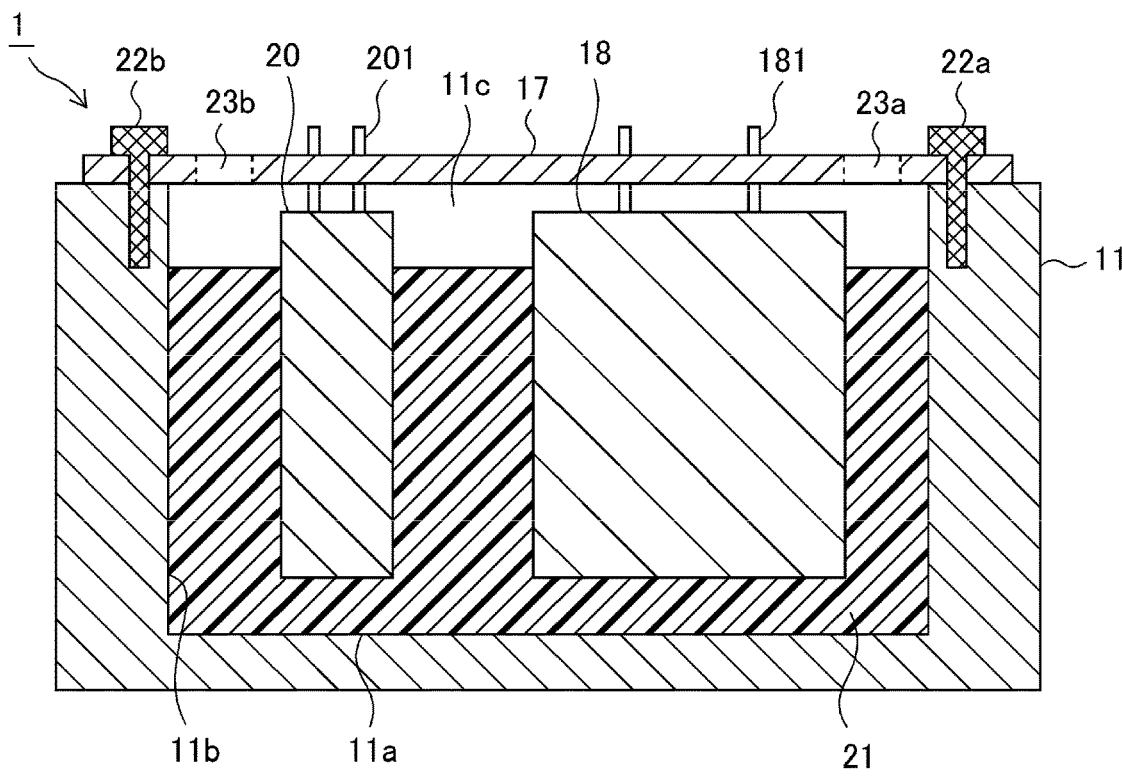
FIG. 2 is a sectional view schematically showing the configuration of the power conversion device according to the first embodiment.

Hereinafter, a power conversion device according to the first embodiment of the present disclosure will be described with reference to the drawings. FIG. 1 is a plan view schematically showing the configuration of the power conversion device according to the first embodiment, and FIG. 2 is a sectional view along line A-A in FIG. 1. In the drawings, the same or corresponding parts are denoted by the same reference characters.

A power conversion device 1 according to the first embodiment is provided between a battery and a motor, as a power conversion device for driving a vehicle such as an electric vehicle or a hybrid vehicle, for example, and performs operations such as output adjustment and phase conversion for power.

As shown in FIG. 1, the power conversion device 1 includes a housing 11, a power module 12, a circuit board 13, a current detection circuit 16, a wiring plate 17, a smoothing capacitor 18, a discharge circuit 19, cast resin 21, and the like.

The housing 11 forms an outer case of the power conversion device 1 and stores the power module 12, the circuit board 13, the current detection circuit 16, the wiring plate 17, the smoothing capacitor 18, the discharge circuit 19, and the like. The housing 11 has a storage portion 11a storing the smoothing capacitor 18 and the resistor 20.

The power module 12 includes a power device (not shown) such as power MOSFET or IGBT. The circuit board 13 includes a driving circuit 14 for driving the power device, and a control circuit 15 for controlling the driving circuit 14. The current detection circuit 16 includes a Hall element, a magneto resistive element, etc., and detects output current from the power module 12.

The wiring plate 17 is a printed board and is connected to the power module 12 and the smoothing capacitor 18. The smoothing capacitor 18 smooths input voltage to the power module 12. The discharge circuit 19 includes a resistor 20 for discharging electric charge stored in the smoothing capacitor 18. The cast resin 21 is included inside the housing 11.

In FIG. 1, the storage portion 11a, the smoothing capacitor 18, the resistor 20, and the cast resin 21 are present under the wiring plate 17 and therefore cannot be seen in a top view, but they are shown by dotted lines, for convenience. In FIG. 1, the storage portion 11a and the wiring plate 17 have rectangular shapes in a top view, but their shapes are not particularly limited. The wiring plate 17 often has a complicated shape corresponding to the internal configuration of the power conversion device 1. Therefore, the wiring plate 17 is desirably made of a material having a high degree of freedom in shape, and is preferably a printed board.

Current paths and operation of the power conversion device 1 configured as described above will be described with reference to FIG. 1. Power conversion device input current P1 inputted to the smoothing capacitor 18 from a power supply (not shown) such as a battery is smoothed by the smoothing capacitor 18, to become power module input current P2. By the circuit board 13 and the power module 12, the power module input current P2 becomes desired power conversion device output current P3 which then passes through the current detection circuit 16 and is supplied to the motor (not shown).

The control circuit 15 collects information such as output current information S4 obtained from the current detection circuit 16 and an external signal (not shown), and calculates a difference between the present motor operation state and a desired motor operation state. On the basis of the calculation result, the control circuit 15 generates a command signal S1 for the driving circuit 14 so as to achieve the desired motor operation state.

The driving circuit 14 generates a command signal S2 for the power module 12 on the basis of the command signal S1 from the control circuit 15. The driving circuit 14 switches a conduction state and a non-conduction state of the power module 12 by the command signal S2, to control the power conversion device output current P3 so as to achieve the desired motor operation state.

At the time of stop of the vehicle, collision thereof, or the like, the discharge circuit 19 consumes electric charge stored in the smoothing capacitor 18 as smoothing capacitor discharge current P4 by the resistor 20, on the basis of the command signal S3 from the control circuit 15. In the first embodiment, the discharge circuit 19 is placed at the wiring plate 17, and the command signal S3 from the control circuit 15 is inputted to the discharge circuit 19 via a signal cable 24.

Connection between the wiring plate 17 and the power module 12 affects the power module input current P2, and therefore it is desirable that they are directly connected without using a cable, a busbar, or the like. If the wiring plate 17 is formed by a printed board, direct connection with the power module 12 can be easily made.

For the purpose of simplifying the system, electric charge stored in the smoothing capacitor 18 may be always consumed by the resistor 20 without providing the command signal S3 from the control circuit 15 to the discharge circuit 19. A plurality of resistors 20 may be provided so that the speed of consumption of electric charge stored in the smoothing capacitor 18 may be switched in accordance with the operation state of the motor.

The power conversion device 1 includes the smoothing capacitor 18 having a comparatively large capacitance in order to smooth ripple current occurring at a timing of switching the conduction state and the non-conduction state of the power module 12. The discharge circuit 19 is electrically connected to the smoothing capacitor 18, and electric charge stored in the smoothing capacitor 18 is discharged by being consumed as heat by the resistor 20. The resistor 20 is a component having great rated power and comparatively large dimensions, and a structure for heat dissipation and vibration protection for the resistor 20 is needed in order to ensure reliability of the discharge circuit 19.

The structure for heat dissipation and vibration protection for the resistor 20 in the power conversion device 1 will be described.

As shown in FIG. 2, a terminal 181 of the smoothing capacitor 18 and a terminal 201 of the resistor 20 are connected to the wiring plate 17, and the smoothing capacitor 18 and the resistor 20 are fixed to one main surface of the wiring plate 17. The storage portion 11a has an opening 11c, and the wiring plate 17 is fixed to the housing 11 so as to cover at least a part of the opening 11c in a state in which the smoothing capacitor 18 and the resistor 20 are placed inside the storage portion 11a. In the first embodiment, as shown in FIG. 1, the wiring plate 17 covers the entire opening 11c of the storage portion 11a.

The wiring plate 17 is fixed to the housing 11 by fixation members 22a, 22b (collectively referred to as fixation members 22) such as screws or rivets, for example. In the first embodiment, the fixation members 22 are provided at two locations, but may be provided at one location or three or more locations. A method for fixing the wiring plate 17 to the housing 11 is not particularly limited and an adhesive or the like may be used.

The cast resin 21 is included inside the storage portion 11a. As the cast resin 21, for example, epoxy-based resin may be used. When the cast resin 21 is not cured, the cast resin 21 is in a liquid state having appropriate fluidity, and after being injected, the cast resin 21 is cured by being heated in a heating furnace or the like, or the cast resin 21 is formed by mixing a main agent and a curing agent, for example. The cast resin 21 needs to be resin having high thermal conductivity, and specifically, it is desirable that the thermal conductivity is 0.2 W/m·K or higher.

The cast resin 21 is provided at least between an inner wall 11b of the storage portion 11a and the smoothing capacitor 18 and between the inner wall 11b of the storage portion 11a and the resistor 20, and is formed integrally. In other words, the cast resin 21 provided between the inner wall 11b of the storage portion 11a and the smoothing capacitor 18, and the cast resin 21 provided between the inner wall 11b of the storage portion 11a and the resistor 20, are at least partially contiguous to each other. The cast resin 21 is provided with a gap from the wiring plate 17.

The cast resin 21 transmits heat generated from the smoothing capacitor 18 and the resistor 20 during operation of the power conversion device 1, to the housing 11, thereby dissipating heat, so as to protect the smoothing capacitor 18 and the resistor 20 from reaching temperatures greater than their respective guaranteed temperatures. In addition, the cast resin 21 provides protection so as not to cause such a trouble that, when the power conversion device 1 is subjected to vibration due to collision of a vehicle or the like, the smoothing capacitor 18 and the resistor 20 excessively vibrate and connection parts with the wiring plate 17, etc., are damaged. That is, the cast resin 21 serves for heat dissipation and vibration protection for the smoothing capacitor 18 and the resistor 20.

These functions are mainly imparted by the cast resin 21 provided between the housing 11 and the smoothing capacitor 18 and between the housing 11 and the resistor 20. In addition, as shown in FIG. 2, the cast resin 21 closely contacts with all side surfaces of the smoothing capacitor 18 other than a side surface from which the terminal 181 protrudes, and with all side surfaces of the resistor 20 other than a side surface from which the terminal 201 protrudes. Thus, since the cast resin 21 closely contacts with the side surfaces of the smoothing capacitor 18 and the resistor 20 so as to surround the side surfaces, reliability of heat dissipation and vibration protection can be ensured, whereby high reliability is obtained.

The wiring plate 17 has one or more through holes 23a, 23b (collectively referred to as through holes 23) at locations opposed to the cast resin 21. In the first embodiment, the wiring plate 17 has the through hole 23a at a location corresponding to a part between the housing 11 and the smoothing capacitor 18, and has the through hole 23b at a location corresponding to a part between the housing 11 and the resistor 20.

If the injection amount of the cast resin 21 is excessive, the cast resin 21 might flow out from a predetermined design range, leading to an adverse effect on operation of the power conversion device 1. Therefore, the injection amount of the cast resin 21 is set so that the cast resin 21 does not come into contact with the wiring plate 17. Since the wiring plate 17 has a plurality of through holes 23, it is possible to inject the cast resin 21 from one through hole 23 and confirm the injection amount from another through hole 23. If three or more through holes 23 are provided, the cast resin 21 can be injected from a plurality of through holes 23 simultaneously.

Figure 3:
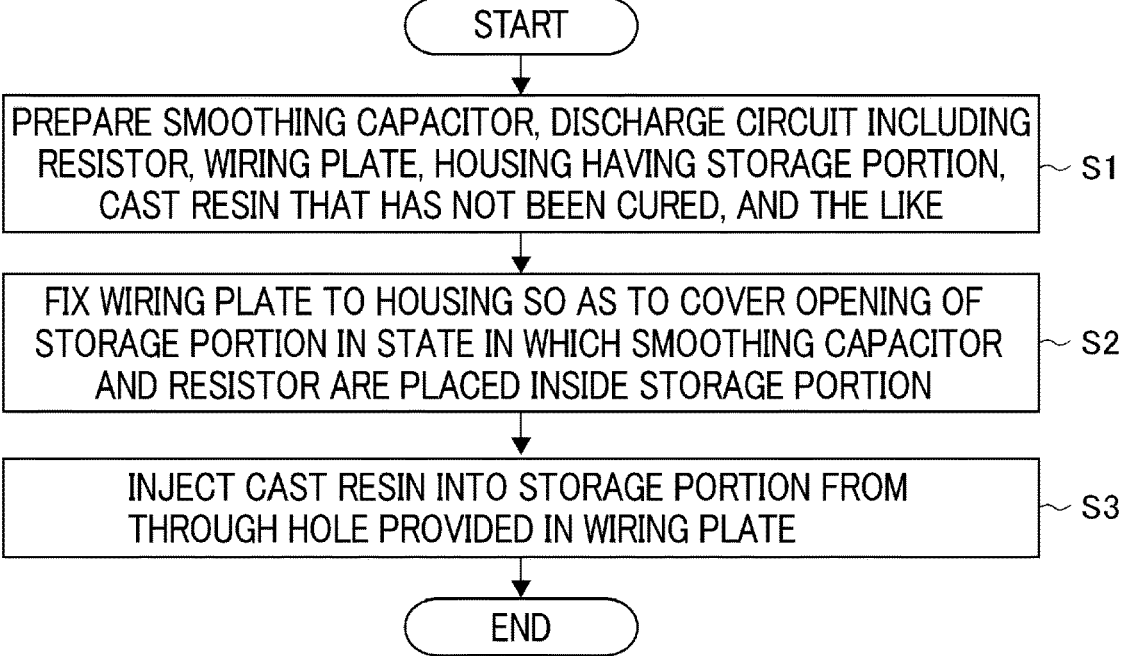
FIG. 3 shows a flow of a manufacturing process for the power conversion device according to the first embodiment.

A flow of a manufacturing process for the power conversion device 1 will be described with reference to a flowchart in FIG. 3.

First, in step S1, the power module 12 including the power device, the smoothing capacitor 18, the discharge circuit 19 including the resistor 20, the wiring plate 17 connected to the power module 12 and the smoothing capacitor 18, the housing 11 having the storage portion 11a, and the cast resin 21 that has not been cured, are prepared. In the first embodiment, the discharge circuit 19 is provided at the wiring plate 17, and the smoothing capacitor 18 and the resistor 20 are fixed to one main surface of the wiring plate 17.

Next, in step S2, the wiring plate 17 is fixed to the housing 11 so as to cover the opening 11c of the storage portion 11a in a state in which the smoothing capacitor 18 and the resistor 20 are placed inside the storage portion 11a. At this time, neither the smoothing capacitor 18 nor the resistor 20 contacts with the inner wall 11*b* of the storage portion 11*a*, and there are gaps therebetween.

Subsequently, in step S3, the cast resin 21 is injected into the storage portion 11*a* from one or more through holes 23 provided in the wiring plate 17 fixed to the housing 11, so that the cast resin 21 is provided at least between the inner wall 11*b* of the storage portion 11*a* and the smoothing capacitor 18 and between the inner wall 11*b* of the storage portion 11*a* and the resistor 20, so as to be formed integrally. Since the cast resin 21 is formed integrally, this operation is completed in one step without the need of performing a plurality of casting steps.

As described above, since the wiring plate 17 has the through holes 23, the casting step in step S3 can be performed after the wiring plate 17 is fixed to the housing 11 in step S2. If the cast resin 21 is injected into the storage portion 11*a* from the opening 11*c* before the wiring plate 17 is fixed to the housing 11, structural parts (e.g., screw holes) of the housing 11 provided for the fixation member 22 might be damaged by scattering of the cast resin 21 that has not been cured.

In the power conversion device 1 according to the first embodiment, heat dissipation and vibration protection for the smoothing capacitor 18 and the resistor 20 are made by the cast resin 21 provided in the storage portion 11*a* so as to be formed integrally. Thus, a dedicated assembly process for the structure for heat dissipation and vibration protection for the resistor 20 is not needed. That is, the structure for heat dissipation and vibration protection for the smoothing capacitor 18 and the resistor 20 can be manufactured at one time in the same process. Thus, the number of components and the number of assembly steps can be decreased and the cost can be reduced, as compared to a case where structures for heat dissipation and vibration protection are manufactured in separate processes.

Since heat dissipation and vibration protection for the resistor 20 are made by the cast resin 21, reliability of heat dissipation and vibration protection for the discharge circuit 19 is ensured more easily as compared to a conventional method of pressing only one surface of the resistor 20 to the housing 11 by means such as screw fastening. Further, since the cast resin 21 closely contacts with side surfaces of the smoothing capacitor 18 and the resistor 20 so as to surround the side surfaces, high reliability is obtained.

In the manufacturing method for the power conversion device 1 according to the first embodiment, the step of injecting the cast resin 21 into the storage portion 11*a* from the through hole 23 provided in the wiring plate 17 is performed after the step of fixing the wiring plate 17 to the housing 11. Therefore, such an adverse effect that the cast resin 21 that has not been cured adheres to a wiring plate fixation part provided to the housing 11, does not occur. Thus, workability is improved and cost reduction is achieved.

Since the wiring plate 17 has a plurality of through holes 23, it becomes possible to confirm the injection amount of the cast resin 21 and inject the cast resin 21 from a plurality of through holes 23 simultaneously, in the casting step. Thus, work accuracy is improved and work time is shortened, so that workability is further improved.

As described above, according to the first embodiment, it is possible to provide the power conversion device 1 and the manufacturing method therefor that can implement the function of the discharge circuit 19 for discharging electric charge stored in the smoothing capacitor 18, at low cost, while ensuring reliability of the discharge circuit 19.

Second Embodiment

Figure 4:
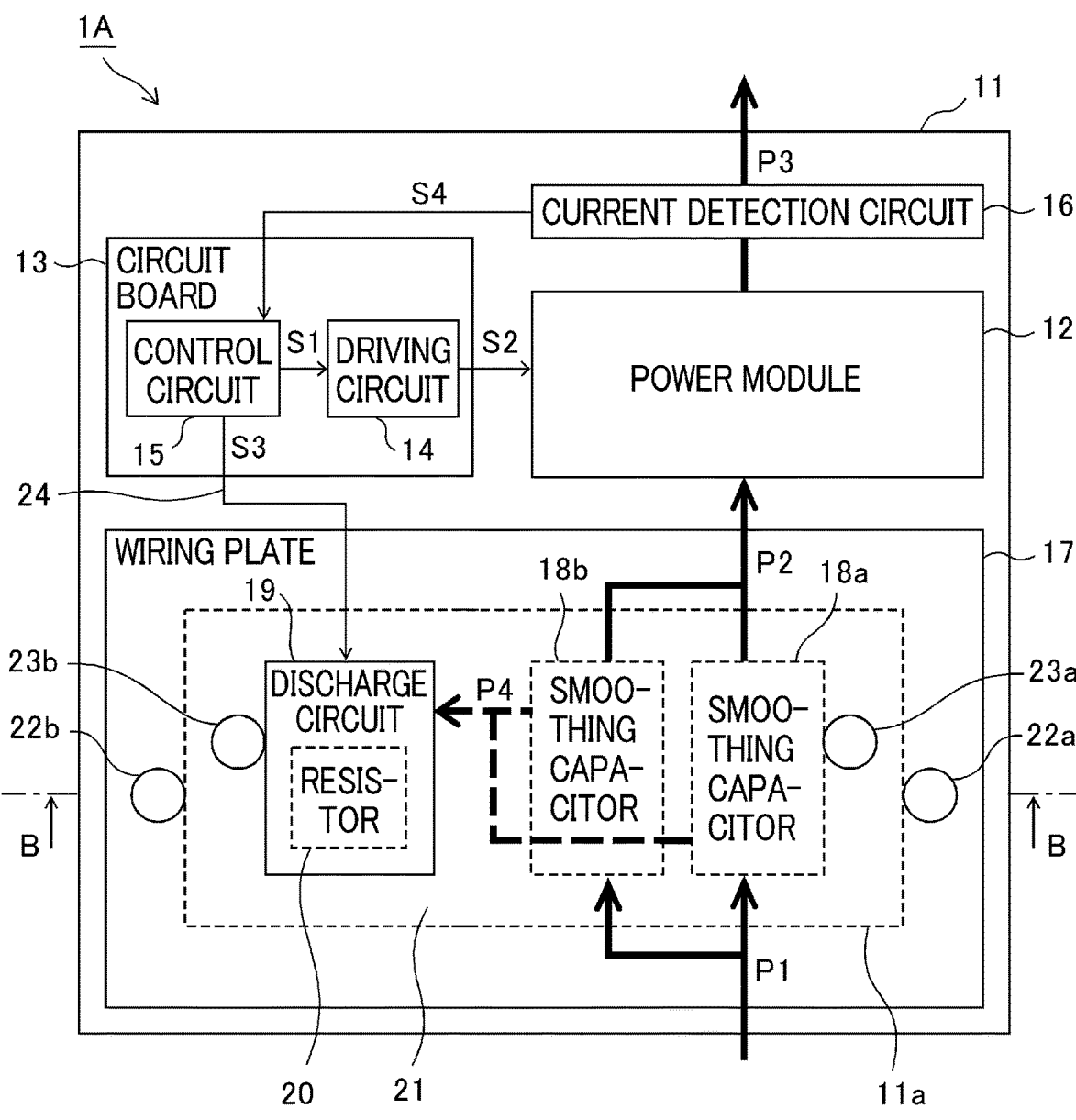
FIG. 4 is a plan view schematically showing the configuration of a power conversion device according to the second embodiment of the present disclosure.
Figure 5:
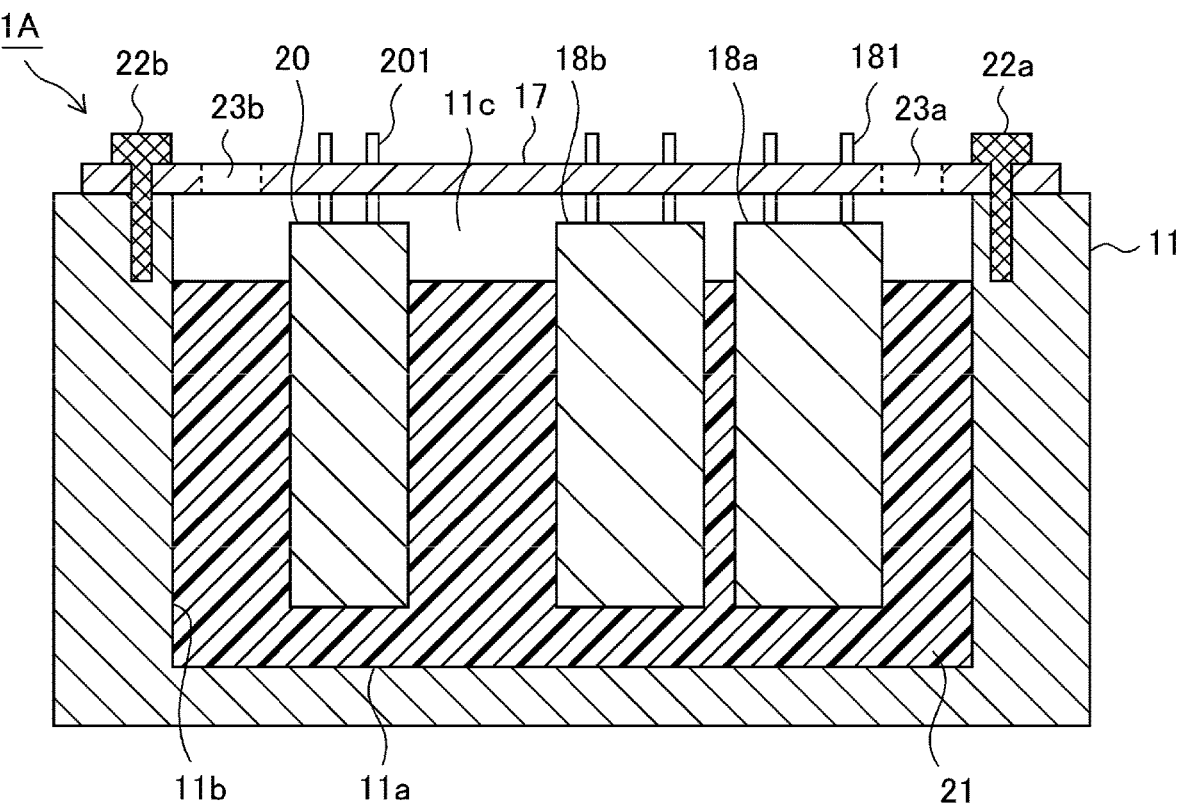
FIG. 5 is a sectional view schematically showing the configuration of the power conversion device according to the second embodiment.

FIG. 4 is a plan view schematically showing the configuration of a power conversion device according to the second embodiment of the present disclosure, and FIG. 5 is a sectional view along line B-B in FIG. 4. In a power conversion device 1A according to the second embodiment, the smoothing capacitor includes a plurality of capacitors. The other configurations in the power conversion device 1A are the same as those in the power conversion device 1 according to the first embodiment, and therefore only difference will be described here.

As shown in FIG. 4, power conversion device input currents P1 split from the power supply (not shown) are respectively inputted to smoothing capacitors 18*a*, 18*b*, and are smoothed by the smoothing capacitors 18*a*, 18*b*. Then, the resultant currents merge as power module input current P2. The discharge circuit 19 is electrically connected to smoothing capacitors 18*a*, 18*b*. At the time of stop of a vehicle, collision thereof, or the like, the discharge circuit 19 consumes electric charge stored in each smoothing capacitor 18*a*, 18*b* as smoothing capacitor discharge current P4 by the resistor 20, on the basis of the command signal S3 from the control circuit 15.

The cast resin 21 is provided at least between the inner wall 11*b* of the storage portion 11*a* and the smoothing capacitors 18*a*, 18*b* and between the inner wall 11*b* of the storage portion 11*a* and the resistor 20. In the second embodiment, the cast resin 21 is also provided between the smoothing capacitor 18*a* and the smoothing capacitor 18*b* and between the smoothing capacitor 18*b* and the resistor 20, so as to be formed integrally. As in the first embodiment, since the cast resin 21 closely contacts with the side surfaces of the smoothing capacitors 18*a*, 18*b* and the resistor 20 so as to surround the side surfaces, reliability of heat dissipation and vibration protection can be ensured, whereby high reliability is obtained.

As described above, also in the case of having a plurality of smoothing capacitors 18*a*, 18*b*, since the cast resin 21 is formed integrally, the cast resin 21 can be provided in one casting step without the need of performing a plurality of casting steps in assembling the power conversion device 1A. That is, even if the smoothing capacitor 18 is divided into a plurality of smoothing capacitors, the number of assembly steps does not increase.

In the power conversion device 1A according to the second embodiment, the same effects as in the power conversion device 1 according to the first embodiment are provided, and in addition, since the smoothing capacitor 18 which is a comparatively large component is divided into a plurality of smoothing capacitors, the degree of freedom in layout in the housing 11 is improved.

Third Embodiment

Figure 6:
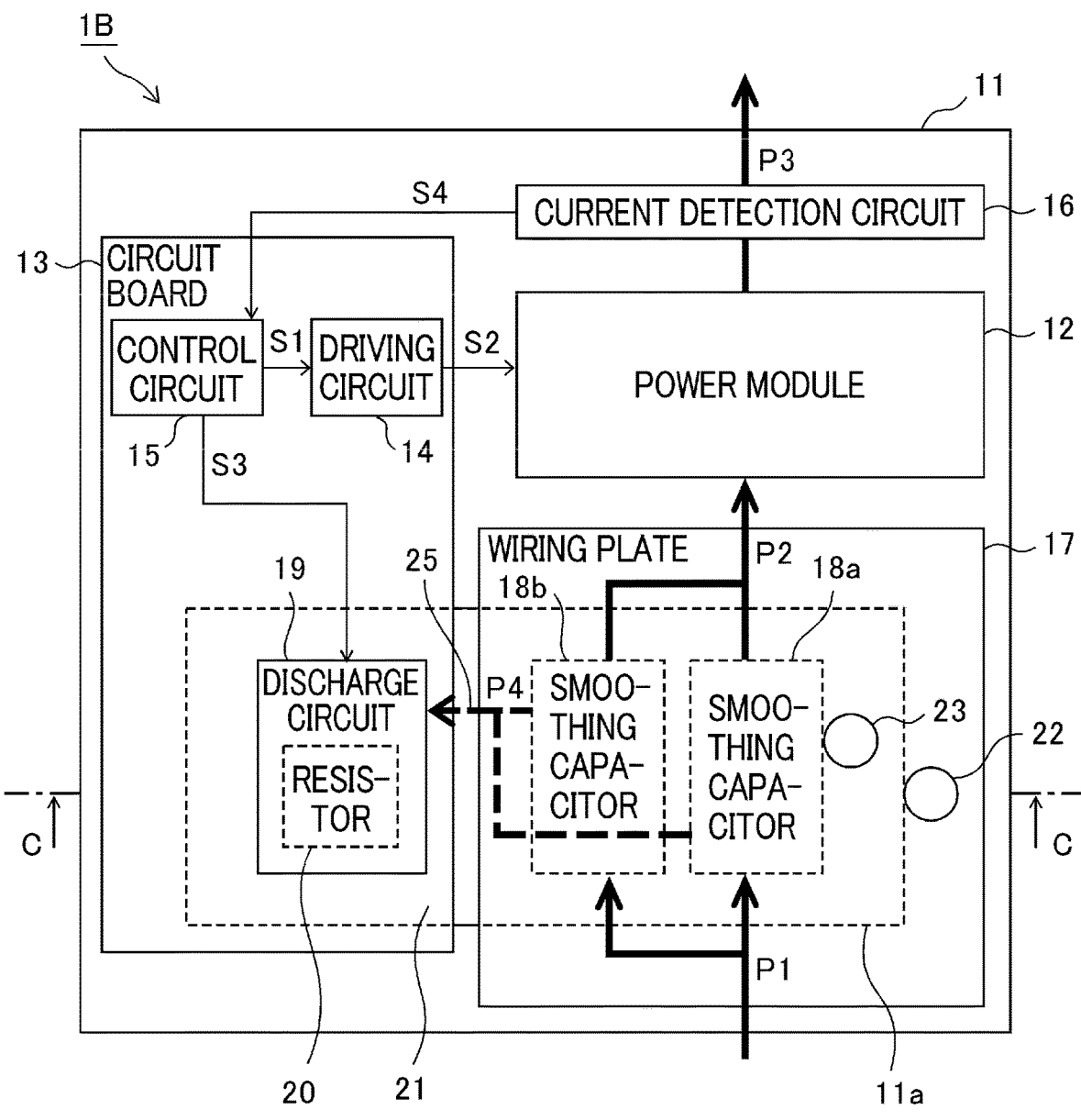
FIG. 6 is a plan view schematically showing the configuration of a power conversion device according to the third embodiment of the present disclosure.
Figure 7:
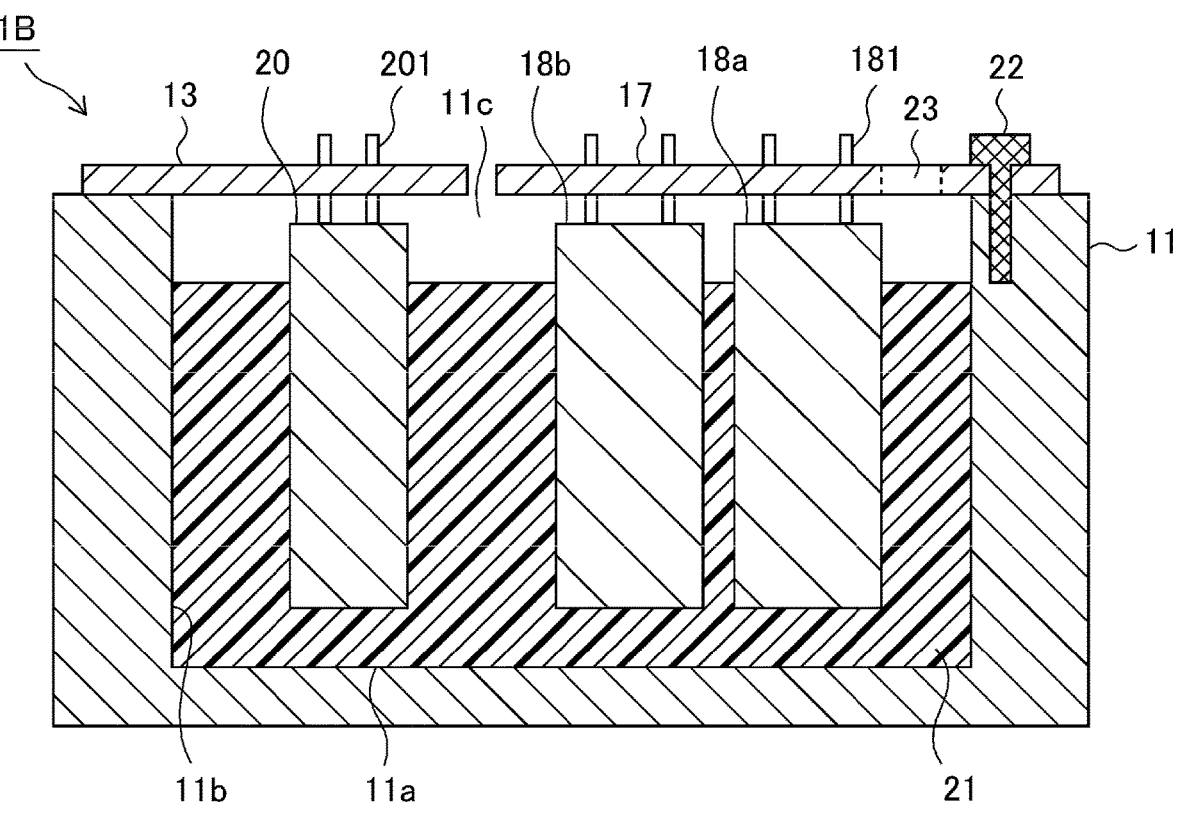
FIG. 7 is a sectional view schematically showing the configuration of the power conversion device according to the third embodiment.

FIG. 6 is a plan view schematically showing the configuration of a power conversion device according to the third embodiment of the present disclosure, and FIG. 7 is a sectional view along line C-C in FIG. 6. In a power conversion device 1B according to the third embodiment, the discharge circuit 19 is provided at the circuit board 13. The other configurations in the power conversion device 1B are the same as those in the power conversion device 1A according to the second embodiment, and therefore only difference will be described.

In the first and second embodiments, the discharge circuit 19 is provided at the wiring plate 17, and the command signal S3 from the control circuit 15 provided at the circuit board 13 to the discharge circuit 19 is inputted via the signal cable 24 (see FIG. 1 and FIG. 4). In general, a signal cable often has a smaller copper-wire diameter than a power cable, and the risk of disconnection thereof due to vibration at the time of collision of a vehicle or the like is higher than in a case of a power cable. Therefore, in order to improve reliability of operation of the discharge circuit 19, it is preferable that the circuit board 13 and the wiring plate 17 are connected via a power cable.

In the third embodiment, since the discharge circuit 19 is provided at the circuit board 13, input of the command signal S3 to the discharge circuit 19 is completed only inside the circuit board 13, so that the signal cable 24 for inputting the command signal S3 from the control circuit 15 to the discharge circuit 19 is not needed. The circuit board 13 and the wiring plate 17 are connected via a power cable 25 for inputting smoothing capacitor discharge currents P4 from the smoothing capacitors 18a, 18b to the discharge circuit 19.

The circuit board 13 is fixed to the housing 11 so as to cover a part of the opening 11c of the storage portion 11a, and the cast resin 21 is provided with a gap from the circuit board 13. The wiring plate 17 has one through hole 23 and is fixed to the housing 11 by the fixation member 22 provided at one location. The fixation members 22 and the through holes 23 may be provided at a plurality of locations of the wiring plate 17.

A flow of a manufacturing process for the power conversion device 1B will be described with reference to the flowchart in FIG. 3 again. In step S1, the power module 12 including the power device, the circuit board 13, the smoothing capacitors 18a, 18b, the discharge circuit 19 including the resistor 20, the wiring plate 17 connected to the power module 12 and the smoothing capacitors 18a, 18b, the housing 11 having the storage portion 11a, and the cast resin 21 that has not been cured, are prepared. In the third embodiment, the discharge circuit 19 is provided at the circuit board 13, and the smoothing capacitors 18a, 18b and the resistor 20 are respectively fixed to one main surface of the wiring plate 17 and one main surface of the circuit board 13.

Next, in step S2, the wiring plate 17 and the circuit board 13 are fixed to the housing 11 so as to cover the opening 11c of the storage portion 11a in a state in which the smoothing capacitors 18a, 18b and the resistor 20 are placed inside the storage portion 11a. For fixation of the circuit board 13 to the housing 11, a screw, a rivet, an adhesive, or the like may be used.

Subsequently, in step S3, the cast resin 21 is injected into the storage portion 11a from the through hole 23 provided in the wiring plate 17 fixed to the housing 11, so that the cast resin 21 is provided at least between the inner wall 11b of the storage portion 11a and the smoothing capacitors 18a, 18b and between the inner wall 11b of the storage portion 11a and the resistor 20, so as to be formed integrally.

In the power conversion device 1B according to the third embodiment, the same effects as in the power conversion devices 1, 1A according to the first and second embodiments are provided, and in addition, since the discharge circuit 19 is provided at the circuit board 13, reliability of the discharge function for consuming electric charge stored in each smoothing capacitor 18a, 18b as smoothing capacitor discharge current P4 by the resistor 20 is improved.

Fourth Embodiment

Figure 8:
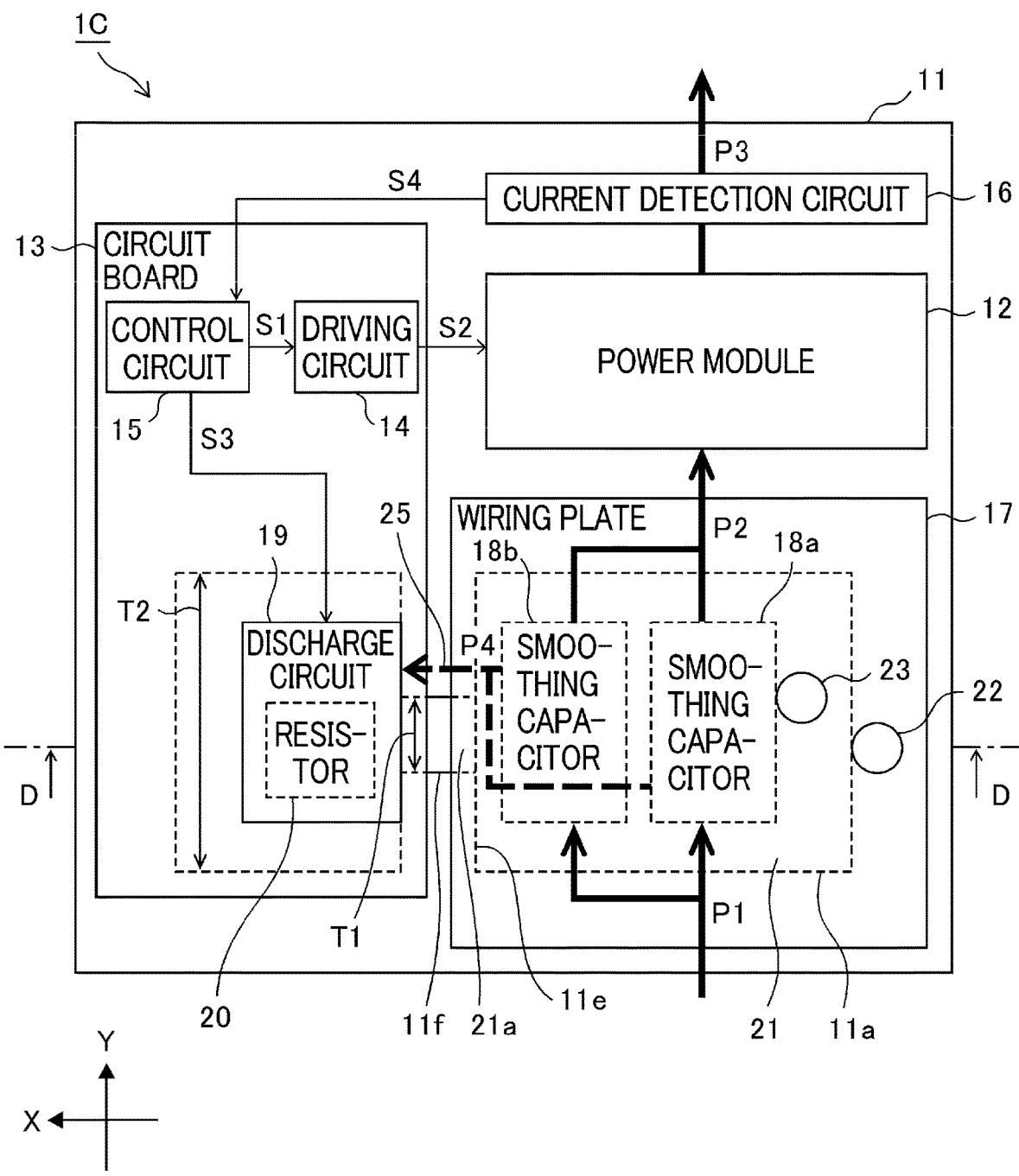
FIG. 8 is a plan view schematically showing the configuration of a power conversion device according to the fourth embodiment of the present disclosure.
Figure 9:
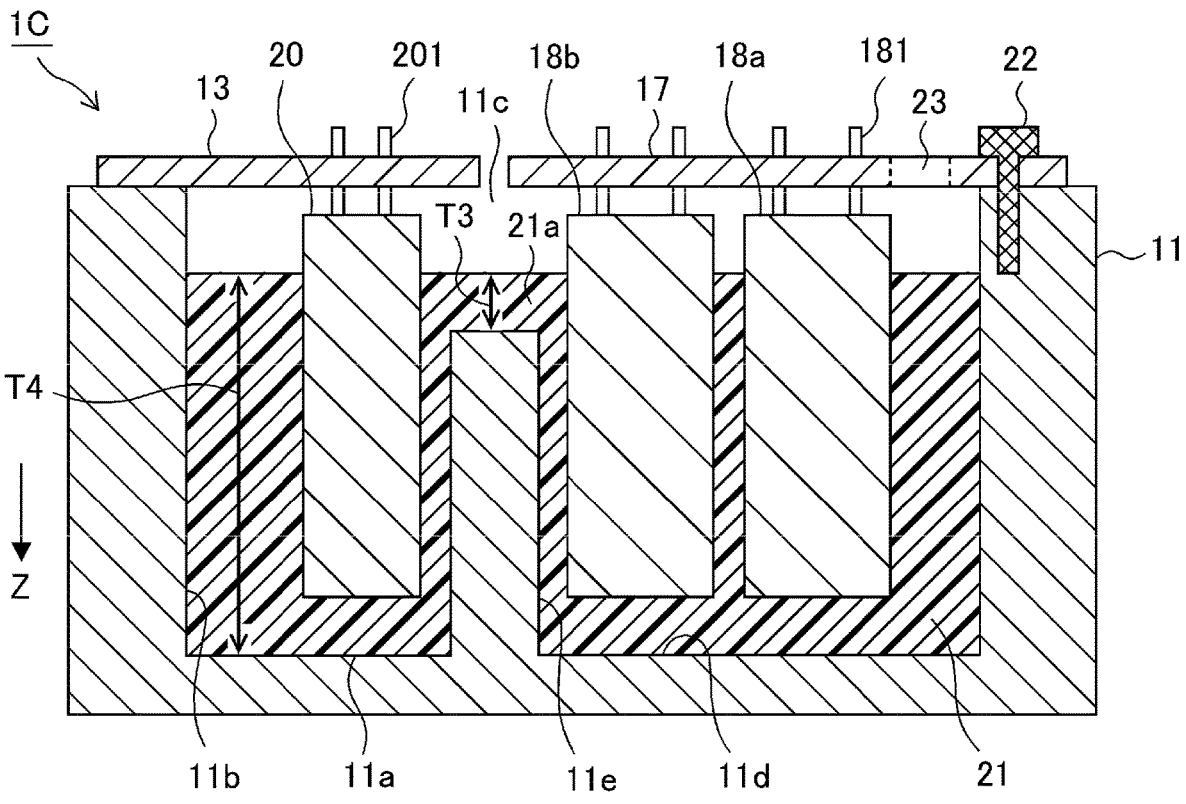
FIG. 9 is a sectional view schematically showing the configuration of the power conversion device according to the fourth embodiment.

FIG. 8 is a plan view schematically showing the configuration of a power conversion device according to the fourth embodiment of the present disclosure, and FIG. 9 is a sectional view along line D-D in FIG. 8. In a power conversion device 1C according to the fourth embodiment, the cast resin 21 is not provided at a part that less contributes to heat dissipation and vibration protection for the smoothing capacitors 18a, 18b and the resistor 20, and thus the volume of the cast resin 21 is reduced. Specifically, a small-thickness area 21a is provided at a part, of the cast resin 21, that does not contribute to or less contributes to heat dissipation and vibration protection.

The cast resin 21 may have the small-thickness area 21a where the resin thickness in a direction perpendicular to a direction from the smoothing capacitor 18b toward the resistor 20 and a depth direction of the opening 11c is smaller than the resin thickness in the other area. In this case, the storage portion 11a has, between the smoothing capacitor 18b and the resistor 20, a partition wall 11e extending toward the opening 11c from a bottom 11d located in the depth direction of the storage portion 11a, and a groove 11f extending in a direction from the smoothing capacitor 18b toward the resistor 20 is provided at an opening-side end of the partition wall 11e. The small-thickness area 21a is provided at the groove 11f.

The cast resin 21 may have, between the smoothing capacitor 18b and the resistor 20, the small-thickness area 21a where the resin thickness in the depth direction of the opening 11c is smaller than the resin thickness in the other area. In this case, the storage portion 11a has, between the smoothing capacitor 18b and the resistor 20, the partition wall 11e extending toward the opening 11c from the bottom 11d located in the depth direction of the storage portion 11a, and the small-thickness area 21a is provided on the opening 11c side of the partition wall 11e.

The small-thickness area 21a of the cast resin 21 in the power conversion device 1C will be described with reference to FIG. 8 and FIG. 9. In FIG. 8 and FIG. 9, the direction from the smoothing capacitor 18b toward the resistor 20 is defined as an X direction, the depth direction of the opening 11c is defined as a Z direction, and a direction perpendicular to the X direction and the Z direction is defined as a Y direction. As shown in FIG. 8, a resin thickness T1 in the Y direction in the small-thickness area 21a is smaller than a resin thickness T2 in the Y direction in the other area. In addition, as shown in FIG. 9, a resin thickness T3 in the Z direction in the small-thickness area 21a is smaller than a resin thickness T4 in the Z direction in the other area. Specifically, the resin thicknesses T1, T3 in the Y direction and the Z direction in the small-thickness area 21a are smaller than the maximum thicknesses of the smoothing capacitors 18a, 18b.

As described above, in the power conversion device 1C, the cast resin 21 has the small-thickness area 21a where the resin thicknesses in the Y direction and the Z direction are respectively smaller than the resin thicknesses in the Y direction and the Z direction in the other area. The dimension in the Z direction of the partition wall 11e is set to be greater than the resin thickness T4 in the other area of the cast resin 21, except for the groove 11f part provided at the opening-side end of the partition wall 11e.

The small-thickness area 21*a* may be an area where the resin thickness in one of the Y direction and the Z direction is smaller. In a case where the small-thickness area 21*a* is an area where the resin thickness T3 in the Z direction is smaller than the resin thickness T4 in the Z direction in the other area, the dimension in the Z direction of the partition wall 11*e* may be set to be equal to a difference between T4 and T3 and the small-thickness area 21*a* may be provided on the opening 11*c* side of the partition wall 11*e*. In this case, the groove 11*f* need not be provided at the opening-side end of the partition wall 11*e*.

The other configurations of the power conversion device 1C and the manufacturing method therefor are the same as in the power conversion device 1B according to the third embodiment, and therefore the description thereof is omitted here. Although the divided smoothing capacitors 18*a*, 18*b* are provided in the power conversion device 1C, one smoothing capacitor 18 may be used as in the first embodiment.

In the power conversion device 1C according to the fourth embodiment, the same effects as in the power conversion devices 1, 1A, 1B according to the first to third embodiments are provided, and in addition, an unnecessary part of the cast resin 21 is removed so that the volume thereof is optimized. Thus, the material cost for the cast resin 21 can be reduced, whereby further cost reduction is achieved. In addition, since the smoothing capacitors 18*a*, 18*b* and the resistor 20 can be placed at locations separate from each other, the degree of freedom in layout is improved.

In the above embodiments, the power conversion devices for driving a single motor has been described. However, the present disclosure is applicable also to a power conversion device for driving a plurality of motors. In this case, a plurality of each component such as the power module may be provided for each motor to be driven, or some components may be shared. In addition, application of the present disclosure is not limited to a power conversion device used for driving a vehicle that travels on a land, and the present disclosure is applicable also to a power conversion device used for driving a ship that travels on water, etc.

Although the disclosure is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

What is claimed is:

1. A power conversion device comprising:
a power module including a power device;
a smoothing capacitor for smoothing input voltage to the power module;
a discharge circuit including a resistor for discharging electric charge stored in the smoothing capacitor;
a wiring plate connected to the power module and the smoothing capacitor;

a housing storing the power module, the smoothing capacitor, the discharge circuit, and the wiring plate; and
cast resin included inside the housing, wherein
the housing has a storage portion storing the smoothing capacitor and the resistor, and
the cast resin is provided at least between an inner wall of the storage portion and the smoothing capacitor and between the inner wall of the storage portion and the resistor, so as to be formed integrally.

2. The power conversion device according to claim 1, wherein
the storage portion has an opening,
the wiring plate is fixed to the housing so as to cover at least a part of the opening, and
the cast resin is provided with a gap from the wiring plate.

3. The power conversion device according to claim 2, wherein
the discharge circuit is provided at the wiring plate.

4. The power conversion device according to claim 2, further comprising a circuit board including a driving circuit for driving the power device and a control circuit for controlling the driving circuit, wherein
the circuit board is fixed to the housing so as to cover a part of the opening of the storage portion,
the discharge circuit is provided at the circuit board, and
the cast resin is provided with a gap from the circuit board.

5. The power conversion device according to claim 2, wherein
the wiring plate has one or more through holes at locations opposed to the cast resin.

6. The power conversion device according to claim 1, wherein
the smoothing capacitor includes a plurality of capacitors.

7. The power conversion device according to claim 1, wherein
the storage portion has an opening, and
the cast resin has, between the smoothing capacitor and the resistor, a small-thickness area where a resin thickness in a direction perpendicular to a direction from the smoothing capacitor toward the resistor and a depth direction of the opening is smaller than the resin thickness in another area.

8. The power conversion device according to claim 7, wherein
the storage portion has, between the smoothing capacitor and the resistor, a partition wall extending toward the opening from a bottom located in the depth direction of the storage portion,
a groove extending in a direction from the smoothing capacitor toward the resistor is provided at an opening-side end of the partition wall, and
the small-thickness area is provided at the groove.

9. The power conversion device according to claim 1, wherein
the storage portion has an opening, and
the cast resin has, between the smoothing capacitor and the resistor, a small-thickness area where a resin thickness in a depth direction of the opening is smaller than the resin thickness in another area.

10. The power conversion device according to claim 9, wherein
the storage portion has, between the smoothing capacitor and the resistor, a partition wall extending toward the opening from a bottom located in the depth direction of the storage portion, and the small-thickness area is provided on the opening side of the partition wall.

11. The power conversion device according to claim 9, wherein the resin thickness in the small-thickness area is smaller than a maximum thickness of the smoothing capacitor.

12. The power conversion device according to claim 1, wherein the cast resin has a thermal conductivity not less than 0.2 W/m·K.

13. The power conversion device according to claim 1, wherein the wiring plate is a printed board.

14. A manufacturing method for a power conversion device, comprising the steps of:

preparing a power module including a power device, a smoothing capacitor, a discharge circuit including a resistor, a wiring plate connected to the power module and the smoothing capacitor, a housing having a storage portion, and cast resin that has not been cured;

fixing the wiring plate to the housing so as to cover an opening of the storage portion in a state in which the smoothing capacitor and the resistor are placed inside the storage portion; and injecting the cast resin into the storage portion from one or more through holes provided in the wiring plate fixed to the housing, so that the cast resin is provided at least between an inner wall of the storage portion and the smoothing capacitor and between the inner wall of the storage portion and the resistor, so as to be formed integrally.

\* \* \* \* \*